(12) United States Patent
Stewart

(10) Patent No.: US 8,346,207 B2
(45) Date of Patent: Jan. 1, 2013

(54) FAULT LOCATION AND CONTROL SYSTEM FOR DISTRIBUTION LINES

(75) Inventor: Ian Alexander Stewart, West Vancouver (CA)

(73) Assignee: Ian Alexander Stewart

( * ) Notice: Subject to any disclaimer, the term of this patent is extended or adjusted under 35 U.S.C. 154(b) by 98 days.

(21) Appl. No.: 13/115,904

(22) Filed: May 25, 2011

(65) Prior Publication Data

US 2012/0302271 A1    Nov. 29, 2012

(51) Int. Cl.
*H04M 9/00* (2006.01)
(52) U.S. Cl. .................. 455/402; 455/404.1; 455/404.2; 713/340
(58) Field of Classification Search .................. 455/402, 455/404.1, 404.2, 412.2, 456.1; 713/340, 713/300; 363/65, 71, 34
See application file for complete search history.

(56) References Cited

U.S. PATENT DOCUMENTS

| | | | |
|---|---|---|---|
| 4,110,684 A | 8/1978 | Gale | |
| 4,297,738 A | 10/1981 | Lee | |
| 4,298,864 A | 11/1981 | Mahnke | |
| 4,313,146 A | 1/1982 | Lee | |
| 4,370,609 A | 1/1983 | Wilson | |
| 4,466,071 A | 8/1984 | Russell | |
| 4,531,024 A * | 7/1985 | Colton et al. | 379/93.14 |
| 4,871,971 A | 10/1989 | Jeerings | |
| 5,475,556 A | 12/1995 | Yoon | |
| 5,548,504 A * | 8/1996 | Takehara | 363/65 |
| 5,550,751 A | 8/1996 | Russell | |
| 5,602,709 A | 2/1997 | Al-Dabbagh | |
| 5,729,144 A | 3/1998 | Cummins | |
| 5,734,575 A | 3/1998 | Snow | |
| 5,790,974 A * | 8/1998 | Tognazzini | 455/456.5 |
| 5,835,321 A | 11/1998 | Elms | |
| 6,249,230 B1 | 6/2001 | Baldwin | |
| 6,292,340 B1 | 9/2001 | O'Regan | |
| 6,407,893 B1 | 6/2002 | Neiger | |
| 6,453,248 B1 | 9/2002 | Hart | |
| 6,667,691 B2 | 12/2003 | Sapir | |
| 7,069,116 B2 | 6/2006 | Kunsman | |
| 7,227,729 B2 | 6/2007 | Parker | |
| 7,330,033 B2 * | 2/2008 | Nakamura | 324/522 |
| 7,400,481 B2 | 7/2008 | Pellon | |
| 7,720,619 B2 | 5/2010 | Hou | |
| 7,840,829 B2 * | 11/2010 | Mizukami et al. | 713/340 |
| 2007/0031618 A1 * | 2/2007 | Nakamura | 428/34.1 |
| 2007/0124619 A1 * | 5/2007 | Mizukami et al. | 713/323 |
| 2007/0211401 A1 | 9/2007 | Mak | |
| 2008/0024140 A1 | 1/2008 | Henson | |
| 2008/0167827 A1 | 7/2008 | McAllister | |

* cited by examiner

*Primary Examiner* — Minh D Dao

(57) ABSTRACT

A location and control system automatically locates, identifies, and corrects faults on a distribution system. The fault location and control system includes a central computer connected at one end of the distribution network and one casing installed at various locations along the distribution network. Each casing encloses a radio transceiver, plus an amplitude modulation detector connected to the radio transceiver. Each casing is installed at a predetermined distance from each other. When a fault is produced in the distribution line, each of the amplitude modulation detectors adjacent to a place where the fault is produced emits a signal that is detected by the central computer. The central computer detects and compares the location of the place where the fault is produced by comparing the time of arrival of the signals. The central computer may then automatically or manually disconnect any part of the distribution network in order to extinguish the fault arc.

8 Claims, 1 Drawing Sheet

US 8,346,207 B2

FAULT LOCATION AND CONTROL SYSTEM FOR DISTRIBUTION LINES

BACKGROUND OF THE INVENTION

The present invention generally relates to an electrical distribution system which conveys power at typically 8 to 16 kilovolts from high voltage transmission lines to small business and residential customers. More particularly, the present invention relates to a control and communication system for automatically locating, identifying and correcting a fault on a distribution system.

Distribution systems generally include one or more power sources connected through a distribution network to one or more delivery points. The distribution systems can experience various faults that may cause fire or disruption of service to consumers. In order to detect the faults, the prior art typically places a plurality of fault detecting devices at various locations throughout the distribution system. These fault detectors emit a visible or audible alarm signal when they detect the fault. Unfortunately, because distribution systems extend over large distances, repair crews may have to patrol the entire distribution network in order to locate the fault. This process is time consuming and, in the event of a fire, time is a critical factor.

As can be seen, there is a need for a detection system that can quickly point out the exact location of a fault in a distribution system.

SUMMARY OF THE INVENTION

In one aspect of the present invention, a fault location and control system includes a central computer located at one end of every distribution line, with at least one casing installed at various locations along the distribution neutral. Each casing encloses a radio plus an amplitude modulation detector connected to the radio. Each casing is installed at a predetermined distance from each other and when a fault is produced in the distribution system, each of the amplitude modulation detectors on each side of the fault emits a signal that is detected by the central computer, which computes the location of the fault by comparing the time of arrival of the two signals.

In another aspect of the present invention, a method for detecting a fault on a distribution line includes the steps of connecting a central computer to one end of the distribution system, and installing a casing at various locations along the distribution system. Each casing encloses a radio transceiver and an amplitude modulation detector connected to the radio. When a fault is produced in the distribution line, each one of the amplitude modulation detectors adjacent to a place where the fault is produced sends a signal to a central computer, which detects and computes the location of the fault, and may disconnect part or all of the network, in order to extinguish the arc produced by the fault.

These and other features, aspects and advantages of the present invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Various inventive features are described below that can each be used independently of one another or in combination with other features.

Broadly, embodiments of the present invention generally provide a location and control system which automatically locates, identifies, and corrects faults on a distribution line.

Figure 1:
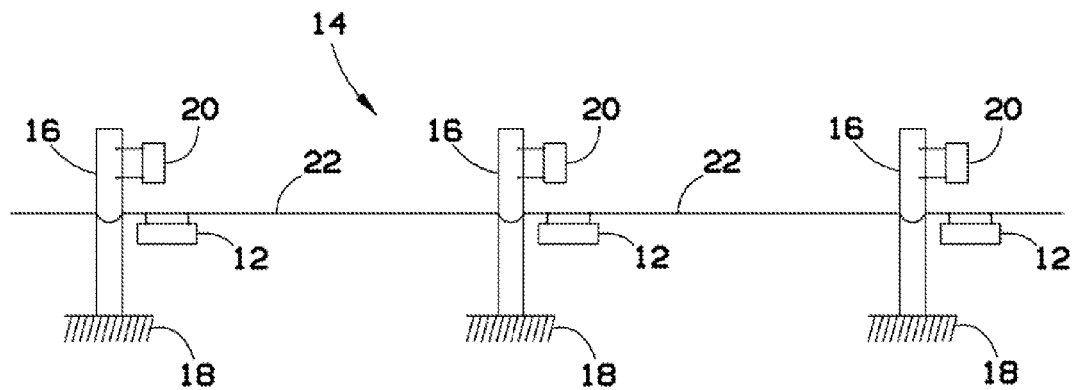
FIG. 1 is a schematic view of a fault location and control system placed on a distribution system.

FIG. 1 illustrates a fault location and control system 10 according to an exemplary embodiment of the present invention. The fault location and control system 10 may be adapted to be installed at various locations along a distribution line (not shown). The distribution line may include a plurality of utility poles 16 secured to the ground 18, a transformer 20 connected to each utility pole 16, and a distribution neutral 22 connecting to adjacent utility poles 16.

The present invention contemplates installing one fault location and control system 10 near a utility pole 16. In some embodiments, the fault location and control system 10 may be installed approximately one mile apart. Each fault location and control system 10 may be enclosed in a casing 12. The casing 12 may be a waterproof casing. The casing 12 may be secured to the distribution neutral 22.

Figure 2:
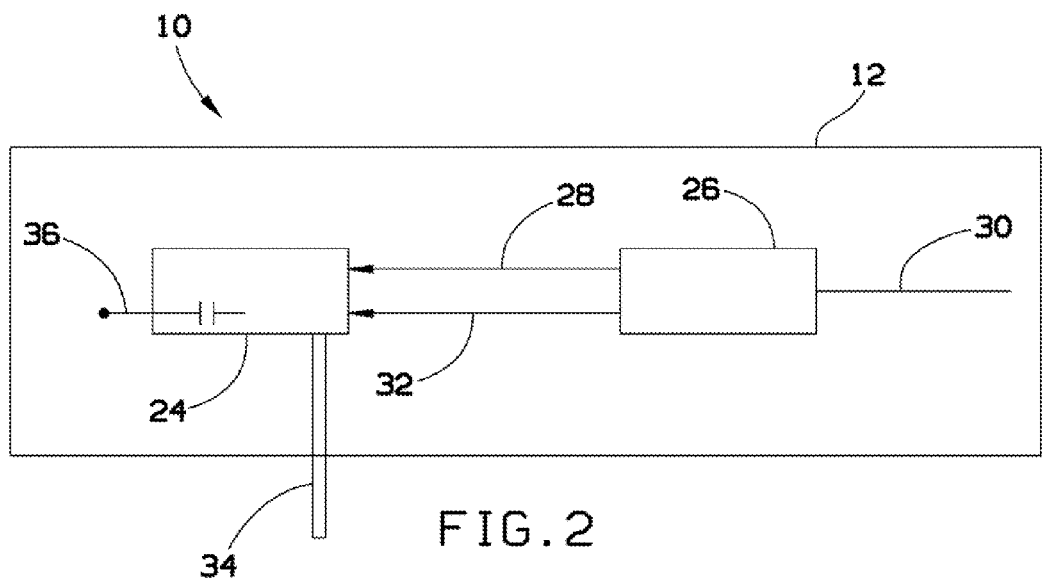
FIG. 2 is a detailed view of the fault location and control system of FIG. 1.

FIG. 2 illustrates a detailed view of the fault location and control system 10. Each fault location and control system 10 may include, inside the casing 12, a radio transceiver 24 and an amplitude modulation detector (AM detector) 26 connected to the radio transceiver 24. Each AM detector 26 may produce an output signal that may be fed to the radio transceiver 24 by a wire 28. The radio transceiver 24 may include an antenna 34 protruding from the casing 12.

The radio transceivers 24 may be any commercially available radio transceivers. In some embodiments, the radio transceivers 24 may be commercially available spread spectrum transceivers (SS transceivers). The radio transceivers 24 may allow communication over distances up to 20 miles. The radio transceivers 24 may be installed about every mile on the distribution line 14. DC power for each radio transceiver 24 may be brought from the AM detector 26 by power wires 32.

The output signal of each AM detector 26 may be in the voice band.

Each AM detector 26 may be powered by a cable 30. The cable 30 may be a 120 volt alternate current (AC) cable. The cable 30 may be connected to the transformer 20 mounted on the near utility pole 16. The AM detector 26 may include a rechargeable battery (not shown). The rechargeable battery (not shown) may provide backup power to the corresponding radio transceiver 24 and the AM detector 26 in case of a power failure.

A contact 36 may protrude from the radio transceiver 24. The contact 36 may be connected to reclosers, disconnects, and breakers normally installed in the distribution line. The contact 36 may be used to remotely control connecting and/or disconnecting the power to part of the entire distribution line, reducing the risk of fire.

Faults in the distribution network 14 may produce a radio noise. When the noise occurs, the two AM detectors 26 installed nearest the location of the fault may simultaneously detect the noise produced by the fault. The two AM detectors 26 on either side of the fault may then send a signal to a central computer (not shown) connected to a central station (not shown) on one side of the distribution line 14.

The signals issued by the adjacent AM detectors 26 may have a different path. The path of the signal issued by the AM detector 26 located far away to the central station (not shown)

may be longer than the path of the signal issued by the AM detector 26 located closer to the central station (not shown). The central computer (not shown) may then calculate the location of the fault by using the difference of the time of arrival of the two signals.

The fault signals may be analyzed by the central computer (not shown) by using a computer program. The computer program may be a Fast Fourier Transform software package. The fault signals may be stored and compared against similar signals stored on a database to determine how the signal was produced. Similar fault types may produce similar fault signals and signals not produced by faults may be screened out—reducing false alarms.

The fault location and control system 10 may allow the user to specifically determine the type and location of the fault in the distribution line 14 before sending the repair crew or fire crew.

A Yagi antenna (not shown) may be used to extend communications signals.

It should be understood, of course, that the foregoing relates to exemplary embodiments of the invention and that modifications may be made without departing from the spirit and scope of the invention as set forth in the following claims.

What is claimed is:

1. A fault location and control system for a distribution system comprising:
    a central computer connected at one end of the distribution line;
    at least one casing adapted to be installed at various locations along the distribution line, each casing enclosing:
        a radio transceiver; and
        an amplitude modulation detector connected to the radio transceiver;
        wherein each casing is installed a predetermined distance from each other;
    wherein when a fault is produced in the distribution line, each one of the amplitude modulation detectors adjacent to a place where the fault is produced, emits a signal; and
    wherein the central computer detects and compares the location of the place where the fault is produced by comparing the time of arrival of the signals.

2. The fault location and control system according to claim 1, wherein one casing is installed near a utility pole having a transformer on the distribution line.

3. The fault location and control system according to claim 1, further including an antenna connected to each one of the radio transceivers, wherein the antenna protrudes from the corresponding casing.

4. The fault location and control system according to claim 1, wherein the radio transceiver is a spread spectrum transceiver.

5. The fault location and control system according to claim 1, further including a contact protruding from the radio transceiver, wherein the contact remotely controls connecting and/or disconnecting the power to part of the entire distribution line.

6. The fault location and control system according to claim 1, wherein the central computer compares each signal to a database including fault signals.

7. The fault location and control system according to claim 1, further including a Yagi antenna connected to some of the casings.

8. A method for detecting a fault on a distribution line, the method comprising the steps of:
    connecting a central computer to one end of the distribution network;
    installing a casing at various locations along the distribution line, wherein each casing encloses a radio transceiver and an amplitude modulation detector connected to the radio transceiver;
    wherein when a fault is produced in the distribution line, each one of the amplitude modulation detectors adjacent to a place where the fault is produced, emits a signal;
    wherein the central computer detects and computes the location of the place where the fault is produced by comparing the time of arrival of the signals; and
    wherein the central computer may automatically or manually disconnect part of the distribution network to extinguish the fault arc and reduce the probability of fire.

* * * * *